(12) United States Patent
Matsuzaki

(10) Patent No.: US 7,880,576 B2
(45) Date of Patent: Feb. 1, 2011

(54) ELECTROMAGNETIC NOISE ABSORBER

(75) Inventor: Toru Matsuzaki, Nagoya (JP)

(73) Assignee: Kitagawa Industries Co., Ltd., Aichi-Ken (JP)

( * ) Notice: Subject to any disclaimer, the term of this patent is extended or adjusted under 35 U.S.C. 154(b) by 45 days.

(21) Appl. No.: 12/267,911

(22) Filed: Nov. 10, 2008

(65) Prior Publication Data

US 2009/0120681 A1     May 14, 2009

(30) Foreign Application Priority Data

Nov. 12, 2007  (JP)  .............................. 2007-293420

(51) Int. Cl.
*H01F 17/06* (2006.01)
*H01F 27/24* (2006.01)
*H01B 7/29* (2006.01)
*H01B 7/08* (2006.01)
*G11B 5/64* (2006.01)

(52) U.S. Cl. ..................... 336/175; 336/212; 336/233; 174/36; 174/117; 428/336; 428/928; 428/929

(58) Field of Classification Search ................. None
See application file for complete search history.

(56) References Cited

U.S. PATENT DOCUMENTS

| | | | |
|---|---|---|---|
| 4,816,614 A * | 3/1989 | Baigrie et al. ................ | 174/36 |
| 5,210,377 A * | 5/1993 | Kennedy et al. ............ | 174/107 |
| 5,349,133 A * | 9/1994 | Rogers ........................ | 174/36 |
| 6,143,406 A * | 11/2000 | Uchida et al. ................ | 428/336 |
| 6,534,708 B2 * | 3/2003 | Ono et al. .................... | 174/36 |
| 7,550,666 B2 * | 6/2009 | Burland et al. ............... | 174/36 |
| 2004/0055772 A1 * | 3/2004 | Tsutsui et al. ................ | 174/36 |

FOREIGN PATENT DOCUMENTS

| | | | |
|---|---|---|---|
| JP | 2001-167933 A | | 6/2001 |
| JP | 2001167933 A | * | 6/2001 |
| JP | 2002204094 A | * | 7/2002 |
| JP | 2002-368478 A | | 12/2002 |
| JP | 2002368478 A | * | 12/2002 |
| JP | 2003-133780 A | * | 5/2003 |
| JP | 2003133780 A | * | 5/2003 |
| JP | 2006-173443 A | | 6/2006 |
| JP | 2006-315368 A | | 11/2006 |
| JP | 2008-194865 A | | 8/2008 |

* cited by examiner

*Primary Examiner*—Anh T Mai
*Assistant Examiner*—Mangtin Lian
(74) *Attorney, Agent, or Firm*—Davis & Bujold, P.L.L.C.

(57) ABSTRACT

An electromagnetic noise absorber to be attached around an electric cable to attenuate noise transmitted through the electric cable. The electromagnetic noise absorber comprises a strip-like base material and a plurality of ferrite pieces fixed to the strip-like base material. The plurality of ferrite pieces are formed by fixing a sheeted ferrite sintered body to the strip-like base material, and subsequently splitting the sheeted ferrite sintered body along split lines oblique with respect to a longitudinal direction of the strip-like base material. The electromagnetic noise absorber is wound around a circumference of the electric cable such that the split lines are parallel to an axial direction of the electric cable, thereby being attached in a spiral manner around the circumference of the electric cable.

7 Claims, 4 Drawing Sheets

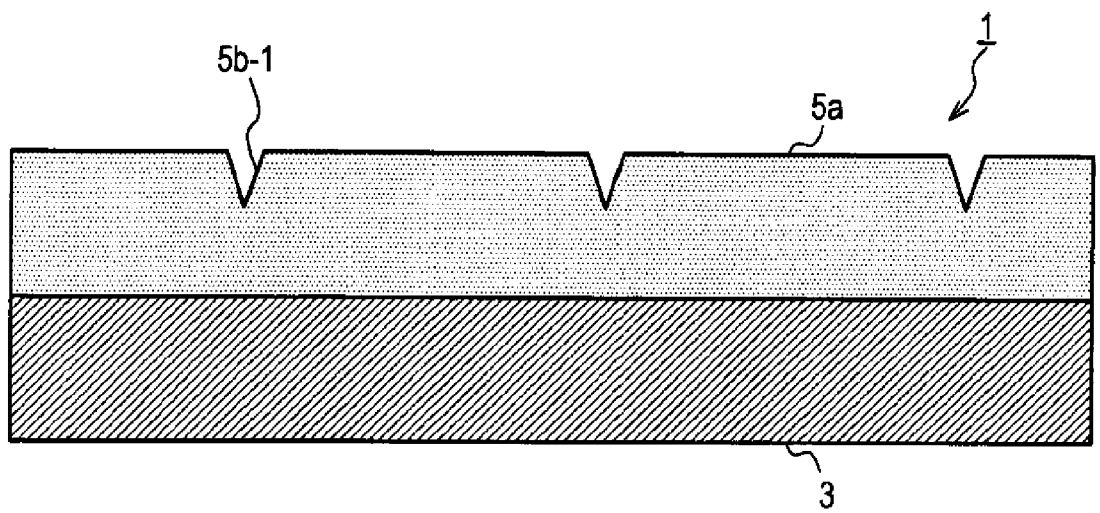
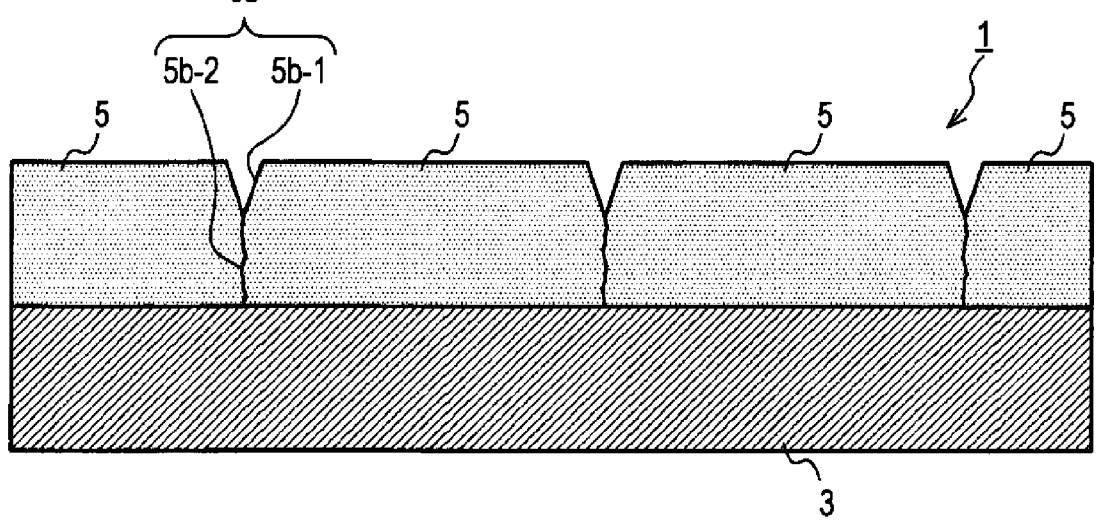

ELECTROMAGNETIC NOISE ABSORBER

CROSS-REFERENCE TO RELATED APPLICATIONS

This application claims the benefit of Japanese Patent Application No. 2007-293420 filed Nov. 12, 2007 in the Japan Patent Office, the disclosure of which is incorporated herein by reference.

BACKGROUND

The present invention relates to an electromagnetic noise absorber that is attached around an electric cable to attenuate noises transmitted through the electric cable.

A typical known electromagnetic noise absorber of this type is constituted, for example, by a plastic housing and a ferrite sintered body housed in the plastic case. However, ferrite sintered bodies are generally easy to break and hard to bend. Accordingly, the above electromagnetic noise absorber is usually configured to be attached to only a small part of an electric cable, and thus is mostly not attachable to a wide range of the electric cable in a longitudinal direction.

Another electromagnetic noise absorber of this type which is attachable to a wide range of the electric cable in a longitudinal direction is also proposed (for example, in Japanese Unexamined Patent Application Publication No. 2003-133780). The proposed electromagnetic noise absorber is constituted by mixing ferrite powder into a resin material to obtain a magnetic composite and forming the magnetic composite into a tubular shape.

The proposed electromagnetic noise absorber, which is unlikely to break even when configured to be relatively long, may be attachable to a wide range of the electric cable in a longitudinal direction. It is also proposed to make a spiral slit in the tubular electromagnetic noise absorber (see FIGS. 4(B) and 4(C) in Japanese Unexamined Patent Application Publication No. 2003-133780). This configuration facilitates easier insertion of an electric cable, and thus may achieve an improved convenience.

SUMMARY

Although the proposed electromagnetic noise absorber is excellent in that the electromagnetic noise absorber will not break, unlike a ferrite sintered body, it is difficult to achieve the same or more excellent magnetic property as the ferrite sintered body since the magnetic composite includes a certain amount of resin material.

Accordingly, when the prior art is the only option, it is only allowed to employ a ferrite sintered body while giving up attaching an electromagnetic noise absorber over a wide range of an electric cable along a longitudinal direction thereof, or attach an electromagnetic noise absorber over a wide range of an electric cable along a longitudinal direction thereof while giving up employing a ferrite sintered body The present invention, which has been made to solve the above problems, has an object to provide an electromagnetic noise absorber that is attached around an electric cable along a along a longitudinal direction thereof although a ferrite sintered body is employed.

In a first aspect of the present invention, there is provided an electromagnetic noise absorber to be attached around an electric cable to attenuate noise transmitted through the electric cable. The electromagnetic noise absorber comprises a strip-like base material and a plurality of ferrite pieces fixed to the strip-like base material. The plurality of ferrite pieces are formed by fixing a sheeted ferrite sintered body to the strip-like base material, and subsequently splitting the sheeted ferrite sintered body along split lines oblique with respect to a longitudinal direction of the strip-like base material. The electromagnetic noise absorber is wound around a circumference of the electric cable such that the split lines are parallel to an axial direction of the electric cable, thereby being attached in a spiral manner around the circumference of the electric cable.

In the electromagnetic noise absorber, the plurality of ferrite pieces are preferably constituted by soft magnetic ferrite, and specifically by, for example, Ni—Zn ferrite, Mn—Zn ferrite, Mn—Mg—Zn ferrite, Mg—Cu—Zn ferrite, Ni—Cu—Zn ferrite, Cu—Zn ferrite, Ba ferrite, or ferrox planar type ferrite.

The plurality of ferrite pieces are formed by splitting the sheeted ferrite sintered body along the split lines. The sheeted ferrite sintered body has a thickness of preferably about 0.01 mm-2 mm and more preferably about 0.05 mm-0.5 mm.

To split the sheeted ferrite sintered body along the split lines, grooves may be previously formed at positions corresponding to the split lines in the sheeted ferrite sintered body. Subsequently, the sheeted ferrite sintered body may be split along the grooves. In a case of forming the grooves, intervals between the neighboring grooves may be about 0.1 mm-5 mm, and preferably about 0.5 mm-3 mm, in order to maintain a width of each of the ferrite pieces so as to achieve excellent property as an electromagnetic noise absorber, When a width of each of the grooves is about 0.001 mm-1 mm, and preferably about 0.01 mm-0.5 mm, it may be easier to split the sheeted ferrite sintered body and also magnetic property may be secured. A depth of each of the grooves may be about 5%-95%, and more preferably about 33%-69%, of the thickness of the sheeted ferrite sintered body, to thereby both achieve easiness in split and magnetic property.

The grooves are formed having an angle oblique to the longitudinal direction of the strip-like base material. The angle may be 20-80 degrees, and preferably 30-60 degrees, in a case where an angle corresponding to the longitudinal direction of the strip-like base material is set as 0 degree and an angle perpendicular to the longitudinal direction of the strip-like base material is set as 90 degrees.

Further, it may also be possible to form a plurality of recesses or a plurality of through holes arranged in broken lines instead of forming successive grooves in continuous lines, and split the sheeted ferrite sintered body along the broken lines. Also in the case of forming such recesses or through holes, width, diameter, depth, angle of split lines may be determined as the above described grooves.

Any appropriate method of forming grooves in continuous lines or forming recesses or through holes in broken lines in the sheeted ferrite sintered body may be employed. For example, it may be possible to form grooves, recesses or through holes (hereinafter, collectively referred to as "grooves or the like") in the sheeted ferrite sintered body with a laser beam machine including a $CO_2$ laser, a YAG laser, etc. Alternatively, it may be possible to form grooves with a single blade or a Thompson blade, or to provide protrusions or projections for forming grooves or the like in a mold for forming a sheeted ferrite sintered body.

Also, it is optional when the grooves or the like are formed. For example, it may be possible to form grooves or the like in a green sheet before sintering of a sheeted ferrite sintered body and sinter the green sheet. It also may be possible to carve or bore grooves or the like after sintering of a sheeted ferrite sintered body.

The sheeted ferrite sintered body with the grooves or the like formed therein is fixed to the strip-like base material. The strip-like base material, as the name suggests, has a strip-like shape having a certain width and a thickness smaller than the width and being elongated along a longitudinal direction thereof, and is flexibly bendable. Specifically, the thickness of the strip-like base material is, for example, about 0.001 mm-0.5 mm, and preferably is about 0.01 mm-0.1 mm. The width and the length of the strip-like base material are optional, and preferable width and length may vary depending on an outer diameter of an electric cable and a length of a range to be wound around.

There is no particular limitation to a material for the strip-like base material as long as the material is easy to handle as a strip. It is preferable to employ, for examples, PET (polyethylene terephthalate), PEN (polyethylene naphthalate), PPS (polyphenylene sulfide), PVC (polyvinyl chloride), PBT (polybutylene terephthalate), PA (polyamide), PI (polyimide), PAI (polyamideimide), PES (polyethersulfone), PEEK (polyetheretherketone), polyurethane, silicone elastomer, fluororesin, polyolefin, etc.

The strip-like base material may have an optional microscopic structure as long as having substantially a strip-like shape. For example, a film sheet, woven cloth, nonwoven cloth, foam, or the like of the above mentioned materials, once formed into a strip-like shape, may be used as the strip-like base material.

After the sheeted ferrite sintered body is fixed to the strip-like base material, the sheeted ferrite sintered body is split along the grooves or the like to provide the plurality of ferrite pieces. Methods for splitting the sheeted ferrite sintered body along the grooves or the like are optional, and one method is to press the sheeted ferrite sintered body with a roller or a like member.

The plurality of ferrite pieces formed as described above are fixed to the strip-like base material, remaining in a state without relative displacement. Accordingly, the ferrite pieces are arranged accurately at initial positions, and are prevented from falling off or scattering.

In addition, since the plurality of ferrite pieces are formed by splitting along the split lines which are oblique with respect to the longitudinal direction of the strip-like base material, when the electromagnetic noise absorber is wound around a circumference of the electric cable such that the split lines are parallel to an axial direction of the electric cable, the electromagnetic noise absorber is attached in a spiral manner around the circumference of the electric cable.

The electromagnetic noise absorber configured as above may cause a loss of noise current flowing through the electric cable by the ferrite pieces having an excellent magnetic property, and thus may absorb noise transmitted through the electric cable. Also, regardless of the use of the ferrite pieces having an excellent magnetic property, the electromagnetic noise absorber may be attached in a spiral manner around the circumference of the electric cable, and thus may be attached over a wide range of the electric cable in the longitudinal direction thereof. The electromagnetic noise absorber, which is attached in a spiral manner around the circumference of the electric cable, may be bent or deflected with the electric cable, may not excessively inhibit a flexural property of the electric cable.

Further, while a sheeted ferrite sintered body is usually apt to be broken or chipped, a sheeted ferrite sintered body is previously split into a plurality of the ferrite pieces, and the ferrite pieces are suppressed from being broken or chipped further excessively. Accordingly, better impact resistance and durability may be achieved, as compared with an electromagnetic noise absorber employing a larger ferrite sintered body.

When the electromagnetic noise absorber is attached in a spiral manner around the circumference of the electric cable, it may be optional whether the plurality of the ferrite pieces are placed on an outer side or an inner side of the strip-like base material.

In the case of placing the ferrite pieces on the outer side of the strip-like base material, there is an advantage that the electromagnetic noise absorber may be easily bent, facilitating winding of the electromagnetic noise absorber around the electric cable may be relatively easy.

In the case of placing the ferrite pieces on the inner side of the strip-like base material, the electromagnetic noise absorber may be somewhat difficult to be bent. However, neighboring ferrite pieces are in press-contact with one another, which leads to a higher continuity of the plurality of ferrite pieces, and thus an improved magnetic property. It may, therefore, be possible to determine optionally whether to place the ferrite pieces on the outer side or the inner side of the strip-like base material.

In the case of placing the ferrite pieces on the inner side of the strip-like base material, it may also be possible to employ a flexible strip-like base material, so that the strip-like base material may extend when neighboring ferrite pieces are in press-contact with one another, which allows easier bending of the entire electromagnetic noise absorber. Thus, bendability of the electromagnetic noise absorber may be adjusted depending on the material of the strip-like base material.

Alternatively, in the case of placing the ferrite pieces on the inner side of the strip-like base material, it may be possible to provide larger gaps among the ferrite pieces, which allows easier bending of the entire electromagnetic noise absorber. In this case, it may be possible to optimize the gaps among the ferrite pieces considering an outer diameter of a target electric cable to be wound around such that the neighboring ferrite pieces come into press-contact with one another when the electric cable is wound around the target electric cable.

In a second aspect of the present invention, the plurality of ferrite pieces in the electromagnetic noise absorber may be split along split lines parallel to the longitudinal direction of the strip-like base material in addition to the split lines oblique with respect to the longitudinal direction of the strip-like base material.

According to the above configuration, the electromagnetic noise absorber may easily be bent in a width direction of the strip. Even when a relatively wide strip-like base material is employed, the electromagnetic noise absorber may have flexibility. Accordingly, the above configuration may be employed to provide an electromagnetic noise absorber having a large width of the strip.

In a third aspect of the present invention, the strip-like base material in the electromagnetic noise absorber may be constituted by a double-faced adhesive sheet having adhesive surfaces on both front and reverse sides.

According to the above configuration, a sheeted ferrite sintered body may be fixed to the strip-like base material quite easily. Also, when the electromagnetic noise absorber is wound around an electric cable, the electromagnetic noise absorber may be fixed to the electric cable quite easily.

In a fourth aspect of the present invention, the electromagnetic noise absorber may include a coating material that sandwiches the ferrite pieces between the base material and the coating material.

According to the above configuration, the ferrite pieces sandwiched between the strip-like base material and the coating material are unlikely to be damaged. Also, even if any ferrite piece is damaged, fragments or powder of the ferrite piece, or the ferrite piece itself may be prevented from falling off the strip-like base material.

A material for the coating material may be optionally employed from the materials exemplarily listed above as the material for the strip-like base material. The material employed for the strip-like base material and the material employed for the coating material may be the same or different from each other.

Also, the coating material may be affixed to the plurality of ferrite pieces (or the sheeted ferrite sintered body), or may be constituted by coating a material composition for forming the coating material. Coating methods may be application, spraying, silk printing, coating with a coater, etc.

In a fifth aspect of the present invention, the strip-like base material and the coating material may be joined together in both end portions parallel to the longitudinal direction of the strip-like base material.

According to the above configuration, even if fragments or powder of the ferrite piece are produced, the fragments or powder may be enclosed between the strip-like base material and the coating material, and thus may be prevented from falling out.

In a sixth aspect of the present invention, the coating material may have a higher flexibility than the strip-like base material.

Examples of a material having a higher flexibility are various gel compositions, such as olefin gel, styrene gel, urethane gel and silicone gel; various rubbers and various elastomers.

According to the above configuration, the electromagnetic noise absorber may be easily wound around an electric cable with the strip-like base material on an inner side and the coating material on an outer side.

In a seventh aspect of the present invention, the coating material in the electromagnetic noise absorber may be electrically conductive. The electrically conductive coating material, which may be constituted by various materials and is not limited to specific materials, may be, for example, a metal foil. The metal foil may be constitute by, for example, aluminum, copper, nickel, silver, gold, tin, zinc, iron and various alloys having electrical conductivity. Particularly, copper and aluminum, each of which has a high conductivity and is available at a lower cost, is preferable.

The electrically conductive coating material may also be constituted, other than a metal foil, by electrically conductive cloth formed by metal plated woven cloth, electrically conductive nonwoven cloth formed by metal plated nonwoven cloth, a resin film having at least one face coated with a metal layer by vacuum deposition, sputtering, plating, CVD, or the like, and a material formed by filling electrically conductive powder into resins, gels, rubbers, or elastomers.

In this case, it is preferable to employ a flexibly woven cloth and a gel, a rubber, or an elastomer having a high elasticity, in order to achieve a high elasticity of the coating material.

According to the above configuration, noise transmitted through an electrical cable may be absorbed by the ferrite pieces, and also noise components which are not completely absorbed by the ferrite pieces and are emitted from the electrical cable as electromagnetic waves may be shielded by the electrically conductive coating material. Thus, a larger noise suppression effect may be achieved.

BRIEF DESCRIPTION OF THE DRAWINGS

Preferred embodiments of the present invention will be described hereinafter with reference to the drawings, in which:

FIGS. 2A and 2B are explanatory views showing a manner of forming ferrite pieces;

Figure 1A:
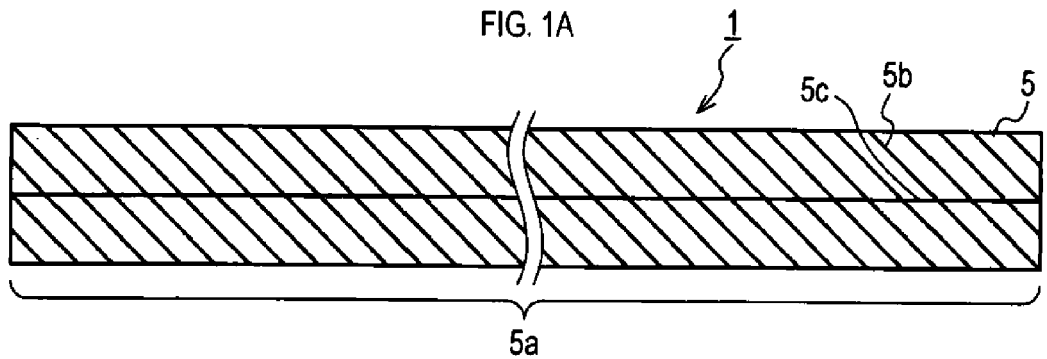
FIG. 1A is a plan view of an electromagnetic noise absorber in a first embodiment of the present invention.
Figure 1B:
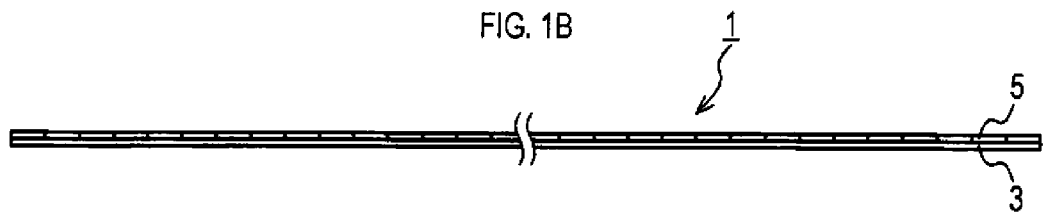
FIG. 1B is a front elevational view of the electromagnetic noise absorber.
Figure 1C:
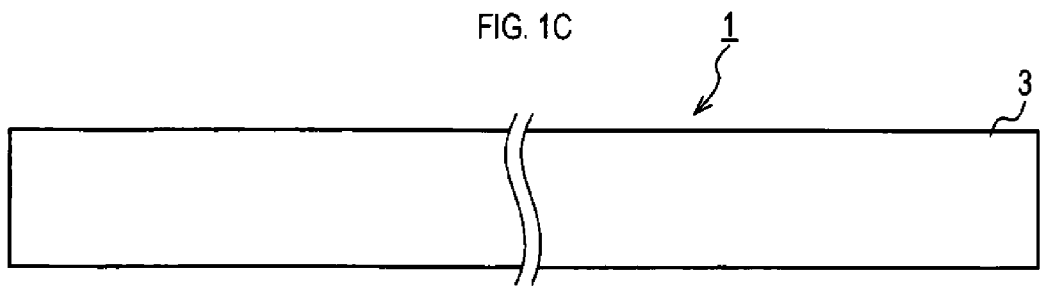
FIG. 1C is a bottom view of the electromagnetic noise absorber.

DETAILED DESCRIPTION OF THE PREFERRED EMBODIMENTS (1) First Embodiment

A first embodiment will now be described. As shown in FIGS. 1A-1D, an electromagnetic noise absorber 1 in the first embodiment includes a strip-like base material 3 and a plurality of ferrite pieces 5 fixed to the strip-like base material 3.

The strip-like base material 3 is constituted by cutting a resin sheet (a PET sheet with a thickness of 0.1 mm in the present embodiment) into a strip-like shape.

The plurality of ferrite pieces 5 are formed by fixing a sheeted ferrite sintered body 5a (for example, Ni—Zn ferrite) on the strip-like base material 3 and then splitting the ferrite sintered body 5a along split lines 5b and a split line 5c. The split lines 5b are oblique lines with respect to a longitudinal direction of the strip-like base material 3, while the split line 5c is a parallel line with respect to the longitudinal direction of the strip-like base material 3.

To split the ferrite sintered body 5a along the split lines 5b and the split line 5c, grooves 5b-1 are previously formed in one face of the ferrite sintered body 5a, as shown in FIG. 2A. Then, a pressure is applied using a roller (not shown) to split the ferrite sintered body 5a along the grooves 5b-1 to thereby form cracks 5b-2, as shown in FIG. 2B. Thus, the plurality of ferrite pieces 5 are obtained.

Before splitting the ferrite sintered body 5a along the grooves 5b-1, a PET sheet, which is to constitute the strip-like base material 3, is heat sealed to the other face of the ferrite sintered body 5a to thereby avoid the plurality of ferrite pieces 5 from being scattered.

In the present embodiment, a sheeted ferrite sintered body with a thickness of 0.2 mm is employed for the ferrite sintered body 5a, and grooves 5b-1 with a width of 0.5 mm and a depth of 0.1 mm (50% of the thickness of the ferrite sintered body 5a) are formed in the one face of the ferrite sintered body 5a using a laser beam apparatus.

Figure 1D:
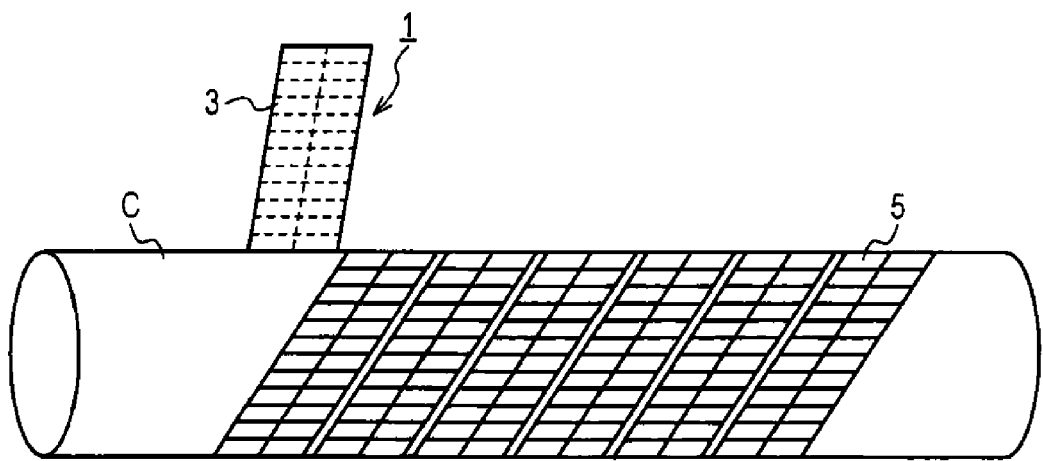
FIG. 1D is a state of use of the electromagnetic noise absorber.

As shown in FIG. 1D, the electromagnetic noise absorber 1 configured as above is wound around an electric cable C such that the split lines 5b are parallel to an axial direction of the electric cable C, and thus, is attached in a spiral manner around a circumference of the electric cable C.

When the electromagnetic noise absorber 1 is attached to the electric cable C, the ferrite pieces 5 having an excellent electromagnetic property may reduce a noise current flowing through the electric cable C, and thus a noise transmitted through the electric cable C may be absorbed.

Also, the electromagnetic noise absorber 1, which may be attached in a spiral manner around a circumference of the electric cable C, although including the ferrite pieces 5 having an excellent electromagnetic property, may be attached in a wide range of the electric cable C in a longitudinal direction.

Further, since the electromagnetic noise absorber 1 is attached in a spiral manner around the circumference of the electric cable C, the electromagnetic noise absorber 1 may be bent or deflected with the electric cable C. Accordingly, a flexural property of the electric cable C will not be excessively inhibited.

When configured into a sheeted form, a ferrite sintered body is usually apt to be broken or chipped. In the electromagnetic noise absorber 1, however, the sheeted ferrite sintered body 5a is previously split into the plurality of ferrite pieces 5, and is less likely to be further broken or chipped. Accordingly, better impact resistance and durability may be achieved, as compared with an electromagnetic noise absorber employing a larger ferrite sintered body.

Moreover, since the ferrite pieces 5 are split by split lines 5b which are oblique with respect to the longitudinal direction of the strip-like base material 3, the electromagnetic noise absorber 1 may be wound around the electric cable C in a manner of drawing a spiral path with a constant pitch only by winding the electromagnetic noise absorber 1 around the electric cable C such that the split lines 5b are parallel to the axial direction of the electric cable C. That is, the electromagnetic noise absorber 1 may be wound around the electric cable C in a state of the spiral path with a constant pitch, unlike a case of winding a simple strip-like material around the electric cable C.

Accordingly, a uniform property of the electromagnetic noise absorber 1 may be achieved all over a range where the electromagnetic noise absorber 1 is wound around, as compared with a case of the spiral path with an inconstant pitch. Also, the electromagnetic noise absorber 1 which is closely attached to the electric cable C may further reduce a noise current, although the sheeted ferrite is employed. Further, the electromagnetic noise absorber 1, which can be closely attached to the electric cable C with a constant pitch, may achieve an improved appearance of a wound state.

(2) Second Embodiment

A second embodiment will now be described. Since a basic configuration is the same as in the first embodiment and a different configuration is partially employed in each of the second and subsequent embodiments, the different configuration will be mainly explained hereinafter.

Figure 3A:
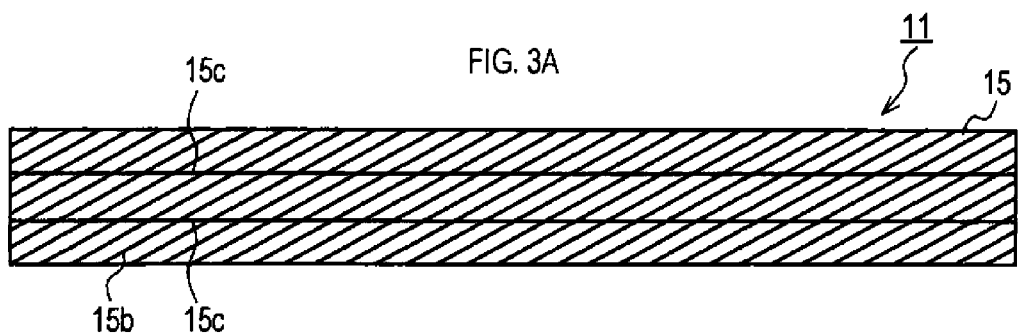
FIG. 3A is a plan view of an electromagnetic noise absorber in a second embodiment of the present invention.

As shown in FIG. 3A, a shape and dimensions of each of ferrite pieces 15 in an electromagnetic noise absorber 11 of the second embodiment are different from those in the first embodiment. Specifically, an inclination of split lines 15b oblique with respect to a longitudinal direction of the electromagnetic noise absorber 11 is smaller than in the first embodiment (a smallest inclination is obtained when the split lines 15b are parallel to the longitudinal direction). When the inclination of the split lines 15b is small, ferrite pieces split only by the split lines 15b are relatively long, and thus are likely to be broken.

Accordingly, two split lines 15c parallel to the longitudinal direction are provided in the electromagnetic noise absorber 11 unlike the first embodiment with one split line. By increasing the number of split lines 15c parallel to the longitudinal direction, a length of each of the ferrite pieces 15 defined by the split lines 15b and 15c will not be excessively long, and thus breakage of the ferrite pieces 15 may be suppressed.

Also, the electromagnetic noise absorber 11 may have a higher flexibility by increasing the number of split lines 15c parallel to the longitudinal direction. Accordingly, particularly in a case of constituting an electromagnetic noise absorber having a large width, the number of split lines 15c parallel to the longitudinal direction should be increased. Since the electromagnetic noise absorber 11 may be used in a same manner as in the first embodiment, no specific explanation of the manner will be given here.

(3) Third Embodiment

Figure 3B:
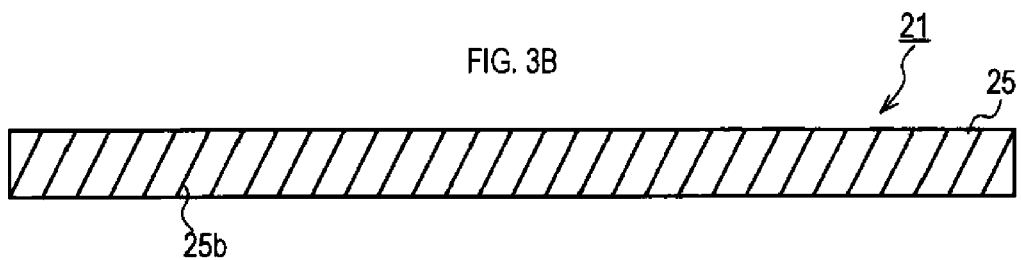
FIG. 3B is a plan view of an electromagnetic noise absorber in a third embodiment of the present invention.

A third embodiment will now be described. As shown in FIG. 3B, an electromagnetic noise absorber 21 in the third embodiment has a smaller width than in the first embodiment. A shape and dimensions of each of ferrite pieces 25 are different from those in the first and second embodiments.

Specifically, an inclination of split lines 25b oblique with respect to a longitudinal direction of the electromagnetic noise absorber 21 is larger than in the first embodiment (a largest inclination is obtained when the split lines 25b are perpendicular to the longitudinal direction). When the inclination of the split lines 25b is large, and a band width of the electromagnetic noise absorber 21 is narrow, ferrite pieces split only by the split lines 25b are relatively short.

Accordingly, it is not necessary to provide any split line parallel to the longitudinal direction as in the first and second embodiments. That is, it is an option in practicing the present invention whether or not to provide a split line parallel to the longitudinal direction. Since the electromagnetic noise absorber 21 may be used in a same manner as in the first embodiment, no specific explanation of the manner will be given here.

(4) Fourth Embodiment

Figure 3C:
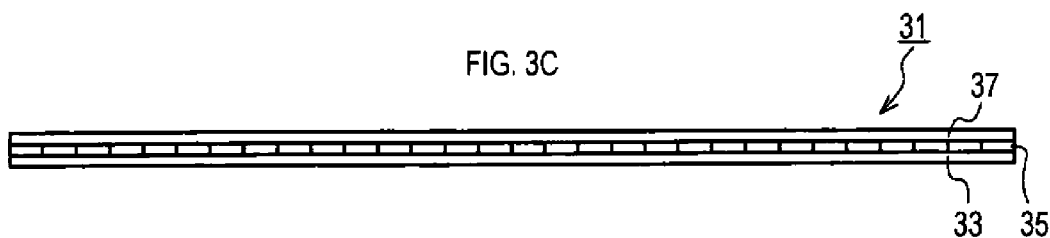
FIG. 3C is a front elevational view of an electromagnetic noise absorber in a fourth embodiment of the present invention.

A fourth embodiment will now be described. As shown in FIG. 3C, an electromagnetic noise absorber 31 in the fourth embodiment includes a coating material 37 in addition to a strip-like base material 33 and a plurality of ferrite pieces 35 which are substantially the same as the equivalents in the first embodiment.

The coating material 37 is constituted by a material having a higher elasticity than the strip-like base material 33 (for example, thermoplastic elastomer). When the coating material 37 is provided, the ferrite pieces 35 sandwiched between the strip-like base material 33 and the coating material 37 are unlikely to be damaged. Also, even if any ferrite piece 35 is damaged, fragments or powder of the ferrite piece 35, or the ferrite piece 35 itself may be prevented from falling off the strip-like base material 33.

When the electromagnetic noise absorber 31 is wound around an electric cable with the strip-like base material 33 on an inner side and the coating material 37 on an outer side, the coating material 37, which is stretched in response to a tensile stress, may enable the electromagnetic noise absorber 31 to be easily wound around the electric cable, as compared with an electromagnetic noise absorber provided with a coating material having a lower elasticity. Since the electromagnetic noise absorber 31 may be used also in a same manner as in the first embodiment, no specific explanation of the manner will be given here.

(5) Fifth Embodiment

Figure 3D:
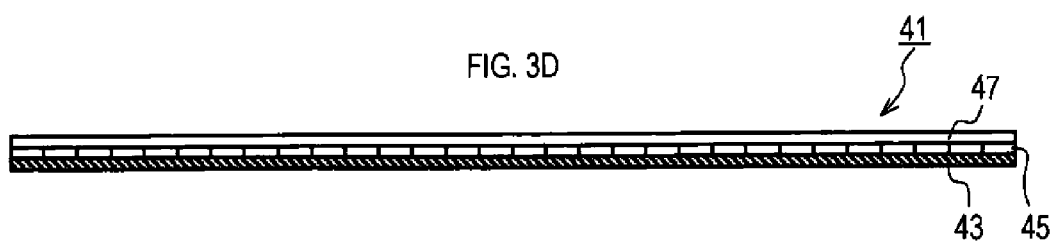
FIG. 3D is a front elevational view of an electromagnetic noise absorber in a fifth embodiment of the present invention.

A fifth embodiment will now be described. As shown in FIG. 3D, an electromagnetic noise absorber 41 in the fifth embodiment includes a strip-like base material 43, a plurality of ferrite pieces 45, and a coating material 47 as in the fourth embodiment. The difference from the fourth embodiment lies in that the strip-like base material 43 is constituted by cutting a double-faced adhesive sheet into a strip-like shape.

By employing the strip-like base material 43, a sheeted ferrite for constituting ferrite pieces 45 may be fixed to the strip-like base material 43 quite easily. Also, when the electromagnetic noise absorber 41 is wound around an electric cable, the electromagnetic noise absorber 41 may be fixed to the electric cable quite easily. Since the electromagnetic noise absorber 41 may be used also in a same manner as in the first embodiment, no specific explanation of the manner will be given here.

(6) Sixth Embodiment

Figure 3E:
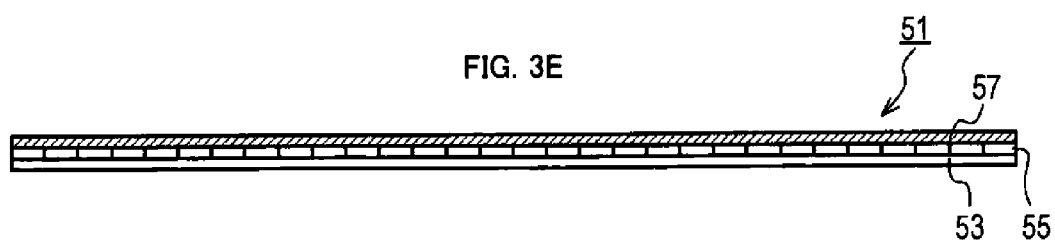
FIG. 3E is a front elevational view of an electromagnetic noise absorber in a sixth embodiment of the present invention.

A sixth embodiment will now be described. As shown in FIG. 3E, an electromagnetic noise absorber 51 in the sixth embodiment includes a strip-like base material 53, a plurality of ferrite pieces 55, and a coating material 57 as in the fourth embodiment. The difference from the fourth embodiment lies in that the coating material 57 has electrical conductivity.

The coating material 57 is constituted by an electrically conductive composite including a thermoplastic elastomer as a matrix and carbon fiber as an electrically conductive filler mixed in the matrix. The coating material 57, which may be constituted by a variety of materials having electrical conductivity, may be constituted using metal foils of aluminum, copper, nickel, silver, gold, tin, zinc, iron, and other various alloys having electrical conductivity, other than the above described electrically conductive composite. Especially, iron and aluminum having high electrical conductivity and available at low cost are preferable as a material for constituting the coating material 57.

In addition, the coating material 57 having electrical conductivity may be constituted by electrically conductive cloth, nonwoven cloth covered with metal plating, or a resin film having at least one face coated with a metal layer by vacuum deposition, sputtering, plating, CVD, or the like. Also, in the case of employing the above described electrically conductive composite, the matrix may be a material other than a thermoplastic elastomer. Specifically, an electrically conductive filler may be filled into a variety of resin materials, gels, rubbers, or the like as the matrix.

When the electrically conductive coating material 57 is provided, not only noise transmitted through an electrical cable may be absorbed by the ferrite pieces 55, but also noise components which are not completely absorbed by the ferrite pieces 55 and are emitted from the electrical cable as electromagnetic waves may be shielded by the electrically conductive coating material 57. Thus, a larger noise suppression effect may be achieved. Since the electromagnetic noise absorber 51 may be used also in a same manner as in the first embodiment, no specific explanation of the manner will be given here.

(7) Seventh Embodiment

Figure 4:
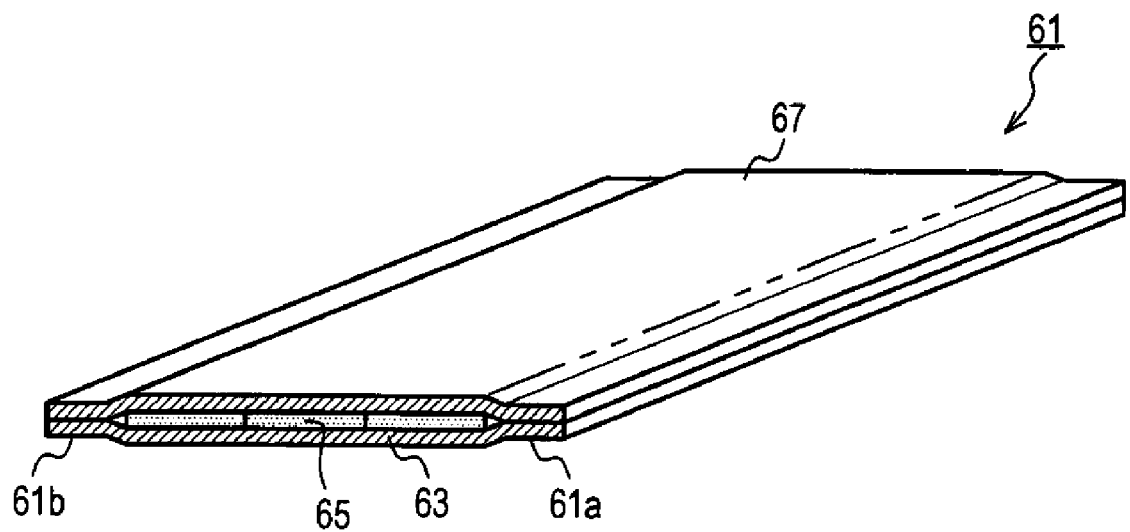
FIG. 4 is a perspective view of an electromagnetic noise absorber in a seventh embodiment of the present invention.

A seventh embodiment will now be described. As shown in FIG. 4, an electromagnetic noise absorber 61 in the seventh embodiment includes a strip-like base material 63, a plurality of ferrite pieces 65, and a coating material 67 as in the fourth embodiment. The difference from the fourth embodiment lies in that the strip-like base material 63 and the coating material 67 are joined together in both end portions 61a and 61b parallel to a longitudinal direction of the electromagnetic noise absorber 61.

According to the above configuration, even if fragments and powder of the ferrite pieces 65 are generated, the fragments and powder may be enclosed between the strip-like base material 63 and the coating material 67 and will not drop out. Since the electromagnetic noise absorber 61 may be used also in a same manner as in the first embodiment, no specific explanation of the manner will be given here.

(8) Modifications

Although the embodiments of the present invention have been described as above, the present invention should not be limited to these specific embodiments, but may be practiced in various forms.

For example, while each characteristic component is employed in each of the first to seventh embodiments, a combination of two or more characteristic components may, of course, be employed. Specifically, for example, a double-faced adhesive sheet illustrated in the fifth embodiment and an enclosing structure illustrated in the seventh embodiment may be employed at the same time to thereby constitute an electromagnetic noise absorber that may achieve both effects resulted from the components.

Alternatively, for example, it may be possible to employ both of a double-faced adhesive sheet illustrated in the fifth embodiment and an electrically conductive coating material illustrated in the sixth embodiment.

Further, while some specific materials are exemplified as the strip-like base material, the ferrite pieces, and the coating material in the above described embodiments, any materials other than the specific materials may be employed as long as respective required functions may be achieved by the materials.

What is claimed is:

1. An electromagnetic noise absorber to be attached around an electric cable to attenuate noise transmitted through the electric cable, the electromagnetic noise absorber comprising:

a strip-like base material; and a plurality of ferrite pieces fixed to the strip-like base material, wherein the plurality of ferrite pieces are formed by fixing a sheeted ferrite sintered body to the strip-like base material and subsequently splitting the sheeted ferrite sintered body along split lines oblique with respect to a longitudinal direction of the strip-like base material, and the plurality of ferrite pieces are also split along split lines extending parallel to the longitudinal direction of the strip-like base material; and the electromagnetic noise absorber is wound around a circumference of the electric cable such that the split lines, which extend obliquely with respect to the longitudinal direction of the strip-like base material, are parallel to an axial direction of the electric cable, thereby being attached in a spiral manner around the circumference of the electric cable.

2. The electromagnetic noise absorber according to claim 1, wherein the strip-like base material is constituted by a double-faced adhesive sheet having adhesive surfaces on both front and reverse sides.

3. The electromagnetic noise absorber accordign to claim 1, further comprising a coating material that sandwiches the ferrite pieces between the base material and the coating material.

4. The electromagnetic noise absorber according to claim 3, wherein the base material and the coating material are joined together in both end portions parallel to the longitudinal direction of the strip-like base material.

5. The electromagnetic noise absorber according to claim 3, wherein the coating material is more flexible than the strip-like base material.

6. The electromagnetic noise absorber according to claim 3, wherein the coating material is electrically conductive.

7. The electromagnetic noise absorber according to claim 1, wherein the ferrite pieces are substantially free of any ferrite resin.

* * * * *